Nov. 12, 1963 W. R. SMITH-VANIZ ETAL 3,110,869
INTERSTAGE COUPLING METHODS AND APPARATUS
FOR TRANSISTOR AMPLIFIERS
Filed April 22, 1960
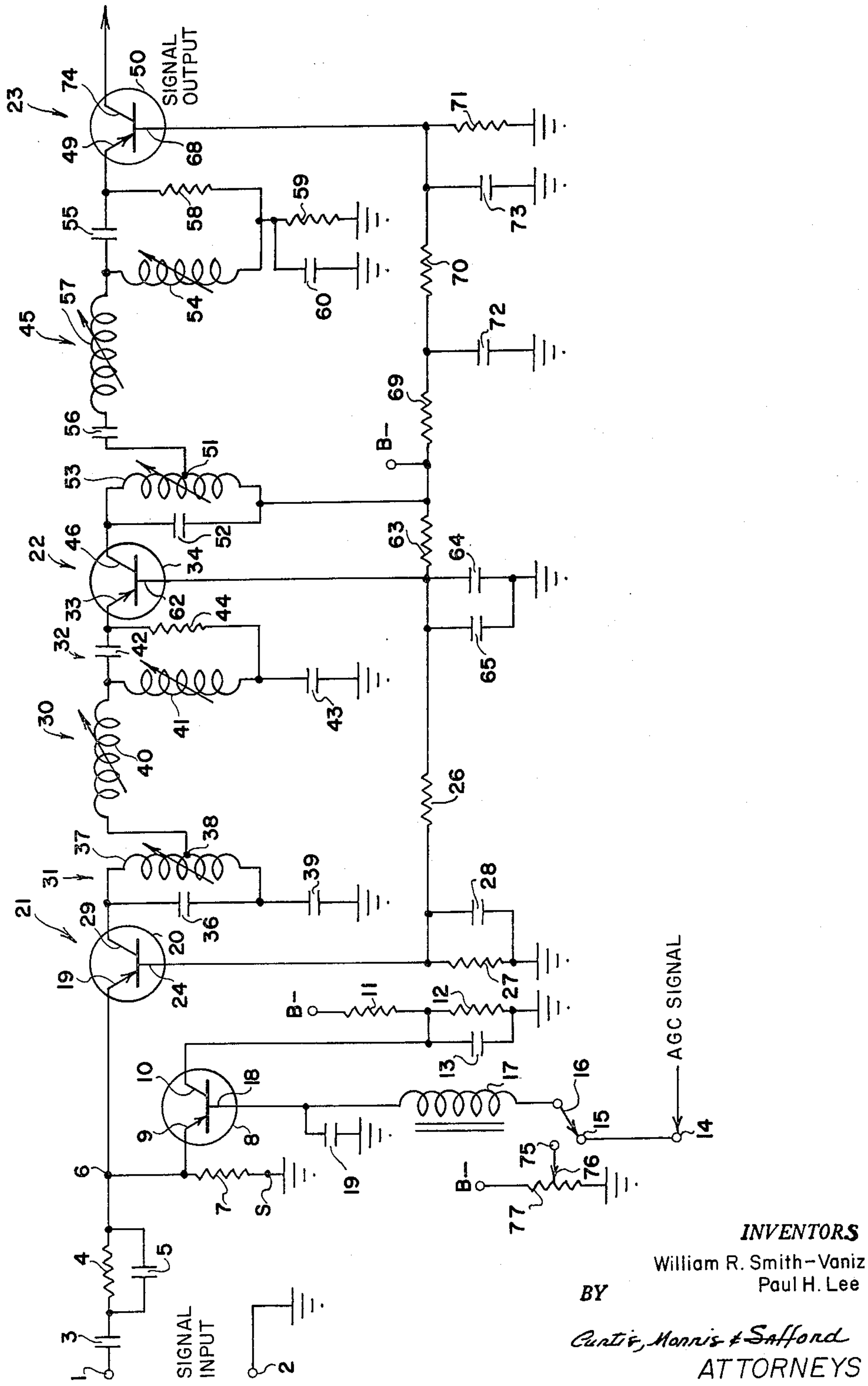
INVENTORS
William R. Smith-Vaniz
Paul H. Lee
BY
Curtis, Morris & Safford
ATTORNEYS United States Patent Office 3,110,869

Patented Nov. 12, 1963

3,110,869

INTERSTAGE COUPLING METHODS AND APPARATUS FOR TRANSISTOR AMPLIFIERS

William R. Smith-Vaniz and Paul H. Lee, Norwalk, Conn., assignors to Trak Electronics Company, Inc., Wilton, Conn.

Filed Apr. 22, 1960, Ser. No. 23,967
2 Claims. (Cl. 330—21)

The present invention is in the field of transistor amplifiers and concerns interstage coupling methods and apparatus for coupling together successive stages of the amplifier. In this method the collector of the transistor in one stage is fed into a shunt-tuned circuit, and the emitter of the transistor in the next succeeding stage is coupled to a series-tuned circuit. These shunt-tuned and series-tuned circuits form two portions of the coupling network between successive transistors.

Among the many advantages of the interstage coupling method and apparatus of the present invention are the stable frequency characteristics and the constant bandpass characteristics which are provided. These advantages are particularly desirable in transistor amplifiers, such as radio-frequency amplifiers, which are subjected to large changes in the level of the gain, as caused by the automatic gain control. As the gain of the transistor amplifier is changed, any impedance changes which affect the shunt-tuned portion of the interstage coupling network are offset by substantially equal and opposite impedance changes in the series-tuned portion of the coupling network. Thus, the frequency stability and bandpass of the amplifier remains constant in spite of automatic changes in the gain level.

Prior to this invention, the customary practice was to use a coupling network between transistor stages having a symmetrical structure, for example, such as a pair of parallel-resonant circuits. One of these paarllel resonant circuits was fed from the collector of the transistor in the first stage and the other was coupled to the emitter of the transistor in the following stage. Under usual operating conditions the impedance of the collector and emitter circuits of transistors change as their gain is controlled. Decreasing the gain usually causes an increase in the impedance and in the capacitance presented by both the collector and emitter circuits to the interstage coupling network.

When typical prior interstage coupling networks are used, this increase in the impedances of the respective collector and emitter resulting from a reduction in the gain level causes an increase in the "Q" of the coupling network. As a result, its frequency response characteristic becomes more peaked, and the band-width is correspondingly reduced. The increase in capacitance presented by the collector and emitter also tends to cause a shift in the frequency response characteristic as the automatic gain control operates. Increases in the gain produce the opposite effects from those discussed above.

The customary procedure in the prior art has been to load the coupling network heavily with resistance so as to "swamp out" any effects which might otherwise be caused by impedance changes in the transistors. This heavy resistance loading of the coupling network normally causes a mismatching between the transistors and the associated network and so it results in an undesirable loss in overall sensitivity and gain.

The interstage coupling method and apparatus of the present invention overcome these problems of the prior art and provide more stable frequency characteristics and more uniform band-pass response throughout a wide frequency range.

It is a further advantage of the interstage coupling network which is described herein as illustrative of the present invention that it is asymmetrical in configuration and arranged so that the reduced impedance of the collector effectively provides the major portion of the loading at high gain conditions, while the high impedance of the emitter effectively provides most of the loading at low gain conditions. Thus, the operation of the amplifier remains stable in spite of automatic changes in the level of the gain over a large range.

In this specification and in the accompanying drawing are described and shown interstage coupling methods and apparatus for transistor amplifiers embodying the invention, but it is to be understood that this illustrative example is not intended to be exhaustive nor limiting of the present invention, but on the contrary is given for purposes of illustration in order that others skilled in the art may fully understand the invention and the manner of applying the invention in practical use, so that they may modifiy and adapt it in various forms, each as may be best suited to the conditions of a particular use.

The various objects, aspects, and advantages of this invention will be more fully understood from a consideration of the following specification in conjunction with the accompanying drawing which shows a schematic diagram of a transistor amplifier circuit embodying the invention.

The transistor amplifier which is shown by way of example is of a type which is well suited for amplifying electrical signals such as are utilized in radio communications and is described as being a radio-frequency amplifier. The input radio signal to be amplified is applied between the pair of terminals 1 and 2, of which the terminal 2 is connected to the common return circuit or ground of the amplifier. From the terminal 1 the radio signal is coupled through a current-blocking capacitor 3 and passes through an input impedance comprising a resistor 4 shunted by a capacitor 5 to a junction point 6. Connected between this point 6 and the common return circuit is an emitter resistor 7 shunted by an automatic gain control circuit including a control transistor 8 having its emitter 9 connected to the junction point 6 at the top of the resistor 7. The collector 10 of this gain control transistor is energized from the terminal of a suitable power supply, indicated as B−, through a pair of voltage-dropping resistors 11 and 12, with a capacitor 13 shunting the resistor 12 and coupling the collector 10 to the common return, or "ground" circuit, as indicated by the symbol.

In operation, an automatic gain control voltage is applied to a control terminal 14 and by a switch contact 15 to a closed switch arm 16 and then through a filter choke 17 to the base electrode 18 of the transistor 8. This base electrode 18 is by-passed to ground through a suitable bypass capacitor 19. The operation is such that an incoming radio signal of increasing strength applied to the input terminals 1 and 2 causes the base electrode 18 to become more negative, thus drawing an increased current from the return circuit at S through the resistor 7 and into the emitter 9. As a result, the current flow to the emitter 19 in the first stage 20 of the amplifier is reduced, so as to reduce the current flowing in a common direct-current path through the amplifier. The advantages and features of this common direct-current path are described and claimed in our copending application Serial No. 31,201, filed April 22, 1960.

The amplifier includes a first transistor stage 21 arranged in cascade with a second transistor stage 22 and interconnected so that the emitter and collectors of both transistors comprise portions of a common direct-current path passing through these two stages in series. Thus, by controlling the current flow in the emitter-collector circuit of the first transistor a corresponding control is obtained over the second transistor; so that the operating conditions and the gain of both stages is simultaneously controlled.

When an incoming radio signal of increasing strength is received, the current flowing through both stages 21 and 22 is reduced. The gain of both stages is thereby reduced, offsetting the increased signal strength. When the incoming signal weakens, the base electrode 18 becomes less negative, causing an increased current flow along the common D.-C. path through both stages, and their gain increases to compensate from the weaker radio signal.

The input signal to be amplified passes from the junction point 6 into the emitter circuit 19 of a transistor 20 in the first amplifier stage 21. Its base electrode 24 is maintained at a suitable operating voltage by current flow through a filter resistor 26 and a base resistor 27, which is shunted by an R.-F. by-pass capacitor 28.

As shown in the schematic circuit diagram, the interstage coupling network 30 which extends between the stages 21 and 22 has an asymmetrical configuration. The collector 29 of the amplifier transistor 20 feeds into a shunt-tuned or parallel-resonant circuit 31 whereas a series-resonant circuit 32 is connected to the emitter 33 of the transistor amplifier 34 in the second stage. The parallel-resonant circuit presents a high impedance to the collector 29 and includes a capacitor 36 and an adjustable inductance coil 37, with the lower end of this parallel-resonant circuit being coupled to the common return by a coupling capacitor 39. This parallel-resonant circuit forms the input portion of the coupling network 30.

In order to match the higher impedance of the collector circuit 31 with the lower impedance at the succeeding emitter 33, an intermediate tap 38 on the coil 37 is used. This tap is connected through an adjustable coupling inductor 40 to the series-tuned output portion 32 of the coupling network which includes an adjustable inductor 41 which is tuned for series resonance with a capacitor 42 connected to the emitter 33. The opposite side of the coil 41 is effectively tied to the common return circuit by an R.-F. coupling capacitor 43. It will be noted that the inductor 40 in series with the inductor 41 and having the capacitor 32 connected therebetween effectively provide a further reduction in the impedance level.

The operation of this coupling network is as follows: As the gain of the stages 21 and 22 is reduced, as explained above, the impedance of the collector 29 rises in approximately the same proportion as the impedance of the emitter 33. This increase in impedance at the collector 29 causes the effective "Q" of the shunt-tuned circuit 31 to rise. But, the corresponding increase in the impedance at the emitter 33 causes a decrease in the effective "Q" of the series-tuned circuit 32. By virtue of these opposite trends, the overall response characteristics of the coupling network 30 are advantageously held constant.

A damping resistor 44 is connected across the series-tuned circuit 32 for the purpose of somewhat reducing the effects of emitter impedance changes at very low gain conditions, that is, at high emitter impedance values. Throughout most of the range of gain changes the impedance at the emitter 33 is less than the resistance value of the resistor 44, and so the action of the emitter impedance is the dominant factor. However, at conditions of very low gain, the resistor 44 dominates the action and effectively sets a lower limit for the "Q" of this series-tuned circuit 32.

Another way of viewing the advantageous operation of this asymmetrical coupling network is to consider that the lowered impedance of the collector 29 effectively provides most of the loading at high gain conditions, while the high impedance of the emitter 33 effectively provides most of the loading at low gain conditions. Thus, the operation of the amplifier remains stable in spite of automatic gain changes.

A similar asymmetrical coupling network 45 is provided between the collector 46 of the transistor 34 and the emitter 49 of the transistor 50 in the third stage 23. The shunt-tuned input portion of this coupling network includes a capacitor 52 and an adjustable inductance coil 53, having a low-impedance tap 51 therein, and the series-tuned output portion includes a coil 54 and a capacitor 55 connected to the emitter 49. A blocking capacitor 56 is included in series with the coupling inductor 57 to isolate the negative supply voltage B− from the succeeding stage 23. A resistor 58 sets the lower limit for the "Q" of the series-resonant circuit, and a resistor 59 shunted by a capacitor 60 provides a connection for the current to the emitter 49.

In order to energize the amplifier a suitable power supply such as a battery, motor-generator set, or rectifier power supply is used, as will be understood, depending upon the installation. One terminal of this power supply is indicated at B− and the other terminal thereof is suitably connected to the common return circuit as will be understood. The bias voltage for the base electrode 62 of the transistor 34 is obtained from the power source by means of a filter resistor 63 and an electrolytic filter capacitor 64 which has an R.-F. by-pass capacitor 65, and this filter circuit is connected to the resistor 26. The base bias voltage for the base electrode 68 of the transistor 50 is derived from a series of voltage-dropping resistors 69, 70, and 71, with filter capacitors 72 and 73 connected therebetween. The amplified signal is fed out from the collector 74 of the third stage transistor, as indicated, to suitable output circuits.

If it is desired to operate the amplifier without the action of the automatic gain control, the switch arm 16 is swung over into engagement with a contact 75 connected to a sliding contact 76 of a potentiometer 77 connected between B− and ground to apply a manually adjustable voltage to the base 18. A suitable source of supply voltage is provided for the collector 74 as will be understood.

From the foregoing it will be understood that the interstage coupling methods and apparatus of the present invention are well suited to provide the advantageous operating characteristics described, and since many possible embodiments may be made of the various features of this invention, and as the asymmetrical interstage transistor coupling network herein described may be varied in various parts, all without departing from the scope of the invention, it is to be understood that all matter hereinbeforth or shown in the accompanying drawing is to be interpreted as illustrative and not in a limiting sense, and that in certain instances some of the features may be used without a corresponding use of other features, all without departing from the scope of the invention.

What is claimed is:

1. A transistor amplifier having a plurality of cascaded stages with an asymmetrical coupling network between stages, said amplifier comprising a common return circuit, first and second transistors each having an emitter, a base, and a collector, said bases being connected to the common return circuit, means for applying operating potentials to said transistors, a signal input circuit connected to the emitter of the first transistor, a parallel resonant circuit comprising a first capacitor and a first inductor, said parallel resonant circuit having one side thereof connected to the collector of the first transistor, a second capacitor coupling the opposite side of said parallel resonant circuit to the common return circuit, said first inductor having a tap thereon, a second and third inductor in serial relation, said tap being connected to the second inductor on the opposite end thereof from the end which is connected to said third inductor, a third capacitor coupling said third inductor to the common return circuit, a fourth capacitor coupling the emitter of the second transistor at a point between said second and third inductors, said fourth capacitor and said third inductor forming a series-resonant circuit connected to the emitter of the second stage, and an output circuit connected to the collector of said second transistor.

2. A transistor amplifier for radio-frequency signals including automatic gain control and providing stable operating characteristics in spite of large changes in the effective gain level of the amplifier, said amplifier comprising first and second transistors having first and second emitters, first and second bases, and first and second collectors, respectively, a common return circuit for said amplifier, said first and second bases being connected to said common return circuit, means for applying operating potentials to said transistors, a signal input circuit connected to the first emitter, a parallel-resonant circuit having one end coupled to the first collector and the opposite end coupled to the common return circuit, said parallel-resonant circuit presenting a high impedance to said first collector, said parallel-resonant circuit including a point intermediate its ends for providing a low impedance with respect to the common return circuit, first and second inductors connected in a series circuit, said first inductor being coupled to said point, said second inductor being coupled to the common return circuit, a capacitor having one side connected to the second emitter, said capacitor having its other side connected to said series circuit between said first and second inductor and being resonant with said second inductor, and a signal output circuit connected to the second collector.

References Cited in the file of this patent

UNITED STATES PATENTS

| | | |
|---|---|---|
| 1,708,950 | Norton | Apr. 16, 1929 |
| 2,811,590 | Doremus | Oct. 29, 1957 |